United States Patent
Bedell et al.

(10) Patent No.: US 9,368,415 B1
(45) Date of Patent: Jun. 14, 2016

(54) NON-DESTRUCTIVE, WAFER SCALE METHOD TO EVALUATE DEFECT DENSITY IN HETEROGENEOUS EPITAXIAL LAYERS

(71) Applicant: International Business Machines Corporation, Armonk, NY (US)

(72) Inventors: Stephen W. Bedell, Wappingers Falls, NY (US); John A. Ott, Greenwood Lake, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/630,855

(22) Filed: Feb. 25, 2015

(51) Int. Cl.
*H01L 21/66* (2006.01)
*H01L 21/02* (2006.01)
*G01Q 60/34* (2010.01)

(52) U.S. Cl.
CPC ............. *H01L 22/12* (2013.01); *G01Q 60/34* (2013.01); *H01L 21/02381* (2013.01); *H01L 21/02532* (2013.01); *H01L 21/02538* (2013.01)

(58) Field of Classification Search
CPC ... H01L 21/02381; H01L 22/12; G01Q 60/34
USPC ............................................. 438/14; 257/190
See application file for complete search history.

(56) References Cited

U.S. PATENT DOCUMENTS

| | | | |
|---|---|---|---|
| 5,476,006 A * | 12/1995 | Fujii | G01Q 30/14 250/307 |
| 6,392,229 B1 | 5/2002 | Dana et al. | |
| 6,488,767 B1 * | 12/2002 | Xu | C09G 1/02 117/1 |
| 6,703,626 B2 | 3/2004 | Takaoka et al. | |
| 6,708,556 B1 * | 3/2004 | Kim | B82Y 35/00 73/105 |
| 6,899,762 B2 | 5/2005 | Wenski et al. | |
| 6,995,077 B2 | 2/2006 | Siebert et al. | |
| 7,008,864 B2 | 3/2006 | Dion et al. | |
| 7,205,237 B2 | 4/2007 | Deering et al. | |
| 8,143,147 B1 * | 3/2012 | Kraus | C23C 16/303 117/102 |
| 2004/0069212 A1 * | 4/2004 | Neudeck | C30B 25/18 117/84 |
| 2007/0231488 A1 | 10/2007 | Von Kaenel | |
| 2010/0072515 A1 * | 3/2010 | Park | H01L 21/02494 257/190 |
| 2010/0122385 A1 * | 5/2010 | Hu | B82Y 35/00 850/5 |
| 2010/0141099 A1 * | 6/2010 | Suenaga | H01L 41/187 310/365 |
| 2010/0244196 A1 * | 9/2010 | Yoshida | C30B 25/18 257/615 |
| 2011/0254052 A1 * | 10/2011 | Kouvetakis | H01L 21/02381 257/190 |
| 2013/0065349 A1 | 3/2013 | Assefa et al. | |
| 2013/0207161 A1 * | 8/2013 | Wang | H01L 21/02381 257/190 |
| 2013/0319090 A1 * | 12/2013 | Prest | B22D 2/00 73/78 |
| 2014/0342284 A1 * | 11/2014 | Moriya | G03G 9/0821 430/109.4 |

* cited by examiner

*Primary Examiner* — Moazzam Hossain
(74) *Attorney, Agent, or Firm* — Scully, Scott, Murphy & Presser, P.C.; Louis J. Percello, Esq.

(57) ABSTRACT

A semiconductor material stack of, from bottom to top, a first semiconductor material having a first lattice constant and a second semiconductor material having a second lattice constant that may or may not differ from the first lattice constant and is selected from an III-V compound semiconductor and germanium is provided. The second semiconductor material of the semiconductor material stack is then scanned using an atomic force microscope (AFM) operating in a tapping mode to provide an AFM image of the second semiconductor material of the semiconductor material stack. The resultant AFM image is then analyzed and crystal defects at a topmost surface of the second semiconductor material of the semiconductor material stack can be measured.

20 Claims, 1 Drawing Sheet

NON-DESTRUCTIVE, WAFER SCALE METHOD TO EVALUATE DEFECT DENSITY IN HETEROGENEOUS EPITAXIAL LAYERS

BACKGROUND

The present application relates to a non-destructive method to determine crystal defects in a heteroepitaxial semiconductor material layer that is formed on a surface of a semiconductor substrate.

Characterizing wafer and epitaxy defectivity is a fundamental step in fabricating working semiconductor devices and circuits. It is cost paramount not to waste resources building LSI or VLSI circuits on substrates which will not be high yielding. On silicon and silicon epitaxy, numerous etching methods are employed to ensure only the highest quality, lowest defect density substrates. Also, processing steps are available so that if the processing has an issue, the substrate could be scrapped and costs (both from processing (i.e., bandwidth) and yield loss) could be recovered. With heteroepitaxial semiconductor materials such as III-V compound semiconductors and germanium formed on a Si substrate, the prior art etching methods do not work. In one embodiment, a heteroepitaxial semiconductor material is a semiconductor material that is formed by epitaxy on a surface of an underlying semiconductor material, wherein the underlying semiconductor material has a lattice constant that differs from the lattice constant of the epitaxially grown semiconductor material. GaAs grown on a Si substrate is one example.

The current process to completely understand and characterize defect types in substrates or heteroepitaxial semiconductor materials is by using Plan-view transmission electron microscopy (PV-TEM). PV-TEM can be used to measure defect densities down to approximately $10^6$ to $10^5$ defects per square centimeter. Because of the small imaging area, however, lower defect densities cannot be measured reliably by PV-TEM. Moreover, PV-TEM is destructive and cannot be employed as an in-line process control metrology.

In view of the above, there is a need to provide a non-destructive method to determine crystal defects in heteroepitaxial semiconductor materials.

SUMMARY

A semiconductor material stack of, from bottom to top, a first semiconductor material having a first lattice constant and a second semiconductor material having a second lattice constant that may or may not differ from the first lattice constant and is selected from an III-V compound semiconductor and germanium is provided. The second semiconductor material of the semiconductor material stack is then scanned using an atomic force microscope (AFM) operating in a tapping mode to provide an AFM image of the second semiconductor material of the semiconductor material stack. The resultant AFM image is then analyzed and crystal defects at a topmost surface of the second semiconductor material of the semiconductor material stack can be measured.

In one aspect of the present application, a method of measuring crystal defects in a semiconductor structure is provided. In one embodiment of the present application, the method includes providing a semiconductor material stack of, from bottom to top, a first semiconductor material having a first lattice constant and a second semiconductor material having a second lattice constant that may or may not differ from the first lattice constant and is selected from an III-V compound semiconductor and germanium. Next, a topmost surface of the second semiconductor material is scanned using atomic force microscope (AFM) operating in a tapping mode to provide an image of the topmost surface of the second semiconductor material. A density of crystal defects that intersect the topmost surface of the second semiconductor material is then calculated.

DESCRIPTION

Figure 1:
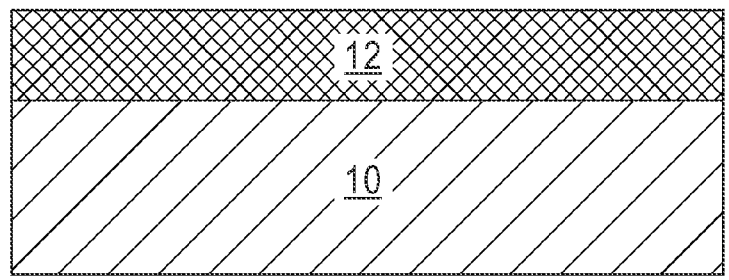
FIG. 1 is a cross sectional view of an exemplary semiconductor structure including a semiconductor material stack of, from bottom to top, a first semiconductor material having a first lattice constant and a second semiconductor material having a second lattice constant that may or may not differ from the first lattice constant and is selected from an III-V compound semiconductor and germanium that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Threading defects (or TDs for short) and stacking faults (or SFs for short) are recombination centers for solid state devices. The term "threading defects" is used throughout the present application to denote edge, screw and/or mixed edge/screw components of dislocations that traverse the thickness of a grown semiconductor layer. The term "stacking faults" is used throughout the present application to denote planar defects resulting from the formation and growth of partial dislocations or atomic stacking errors during crystalline growth.

On surfaces comprised of Si and Si-epitaxial layers, it is difficult to observe any step height associated with the nucleus of these crystalline defects. It was discovered by the Applicant of the present application that on surfaces of heteroepitaxy III-V compound semiconductor layers or germanium layers that the aforementioned defect nuclei have a measurable surface displacement associated therewith which can be measured using an atomic force microscope (AFM)

operating in a tapping mode. Notably, by using an atomic force microscope (AFM) operating in a tapping mode, one is able to directly image crystalline defects of various types that intersect at the topmost surface of a heteroepitaxy layer of an III-V compound semiconductor or germanium. Thus, the present application provides an etch-free and non-destructive method for determining crystal defects in a heteroepitaxy layer of an III-V compound semiconductor or germanium.

Referring first to FIG. 1, there is illustrated an exemplary semiconductor structure including a semiconductor material stack of, from bottom to top, a first semiconductor material 10 and a second semiconductor material 12 that can be employed in accordance with an embodiment of the present application. In the present application, the second semiconductor material 12 forms an interface with the first semiconductor material 10. In some embodiments of the present application, the semiconductor material stack 10, 12 may form a portion of a photovoltaic device.

In accordance with the present application, the first semiconductor material 10 of the semiconductor material stack comprises a semiconductor material having a first lattice constant. The semiconductor material that provides the first semiconductor material 10 of the semiconductor material stack that can be employed in the present application may include, but is not limited to, Si, Ge, SiGe, SiC, SiGeC, III/V compound semiconductor materials such as, for example, InAs, GaAs, InP, GaP, GaN, AlN, InGaAs, InAlP, and InGaP, or II-VI compound semiconductors. In some embodiments of the present application, Si is employed as the first semiconductor material 10.

In one embodiment of the present application, the semiconductor material that provides the first semiconductor material 10 may be a single crystalline semiconductor material. By "single crystalline" it is meant, a material in which the crystal lattice of the entire sample is continuous and unbroken to the edges of the sample, with no grain boundaries. In another embodiment of the present application, the semiconductor material that provides the first semiconductor material 10 may be polycrystalline or multicrystalline.

In one embodiment of the present application, the first semiconductor material 10 may represent an entirety of, or a topmost portion of, a bulk semiconductor substrate. By "bulk" it is meant that the semiconductor substrate is entirely composed of a semiconductor material or a multilayered stack of semiconductor materials.

In another embodiment of the present application, the first semiconductor material 10 may represent a topmost portion of a semiconductor-on-insulator substrate. In such an embodiment, a buried insulator layer and an optional handle substrate are located beneath the first semiconductor material 10. When present, the optional handle substrate is located beneath the buried insulator layer. In some embodiments, the optional handle substrate may comprise one of the semiconductor materials mentioned above for the first semiconductor material 10. In other embodiments, the optional handle substrate and the first semiconductor material 10 comprise a same semiconductor material, e.g., Si or Ge. In another embodiment, the optional handle substrate comprises a different semiconductor material than the first semiconductor material 10. In yet other embodiments, the optional handle substrate is comprised of a non-semiconductor material such as, for example, a dielectric material and/or a conductive material.

In some embodiments, the first semiconductor material 10 may be an intrinsic semiconductor material (i.e., a semiconductor material that is entirely dopant free or a semiconductor material having a dopant concentration of less than 1E17 atoms/cm$^3$). In other embodiments, the first semiconductor material 10 is entirely doped or contains at least one doped region. The dopant that may be present in the first semiconductor material 10 may be a p-type dopant or an n-type dopant. As used throughout the present application, "p-type" refers to the addition of impurities to an intrinsic semiconductor material that creates deficiencies of valence electrons. In one embodiment, the p-type dopant is present in a concentration ranging from 1E17 atoms/cm$^3$ to 1E19 atoms/cm$^3$. In another embodiment, the p-type dopant is present in a concentration ranging from 1E18 atoms/cm$^3$ to 1E20 atoms/cm$^3$. As used throughout the present application, "n-type" refers to the addition of impurities that contributes free electrons to an intrinsic semiconductor. In one embodiment, the n-type dopant is present in a concentration ranging from 1E17 atoms/cm$^3$ to 1E19 atoms/cm$^3$. In another embodiment, the n-type dopant is present in a concentration ranging from 1E18 atoms/cm$^3$ to 1E20 atoms/cm$^3$.

In some embodiments of the present application, the semiconductor material that provides the first semiconductor material 10 may be hydrogenated. In another embodiment of the present application, the semiconductor material that provides the first semiconductor material 10 may be non-hydrogenated.

As stated above, the semiconductor material stack that can be employed in the present application also includes the second semiconductor material 12. In one embodiment of the present application, the second semiconductor material 12 has a second lattice constant that differs from the first lattice constant of the first semiconductor material 10 and is selected from an III-V compound semiconductor and germanium. In another embodiment of the present application, the second semiconductor material 12 has a second lattice constant that is the same as the first lattice constant of the first semiconductor material 10 and is selected from an III-V compound semiconductor and germanium. In such an embodiment the semiconductor material that provides the second semiconductor material 12 is compositionally different from the semiconductor material that provides the first semiconductor material. Throughout the present application, the term "III-V compound semiconductor" denotes a semiconductor material that contains at least one element from Group III of the Periodic Table of Elements and at least one element from Group V of the Periodic Table of Elements. The III-V compound semiconductors may be binary compounds, tertiary compounds, etc. Examples of III-V compound semiconductors that can be employed as the second semiconductor material 12 include, but are not limited to, InAs, GaAs, InP, GaP, InGaAs, InAlP, and InGaP. The atomic percentage of the Group III element(s) and the atomic percentage of the Group V element(s) may vary over a wide range. In one embodiment, the first semiconductor material 10 is Si, and the second semiconductor material 12 is an III-V compound semiconductor material. In another embodiment, the first semiconductor material 10 is an III-V semiconductor compound, and the second semiconductor material 12 is either germanium, or an III-V compound semiconductor that is compositional different from the III-V compound semiconductor of the first semiconductor material 10.

In one embodiment of the present application, the semiconductor material that provides the second semiconductor material 12 may be a single crystalline semiconductor material. In another embodiment of the present application, the semiconductor material that provides the second semiconductor material 12 may be polycrystalline or multicrystalline. In some embodiments of the present application, the semiconductor material that provides the second semiconductor material 12 may be hydrogenated. In another embodiment of the present application, the semiconductor material that provides the second semiconductor material 12 may be non-hydrogenated.

The second semiconductor material 12 may be an intrinsic semiconductor material or it can be doped with either an n-type dopant (as defined above) or a p-type dopant (as defined above). In some embodiments, the second semiconductor material 12 comprises a same conductivity type (either n-type or p-type) as that of the underlying first semiconductor material 10. In yet another embodiment of the present application, the second semiconductor material 12 has an opposite conductivity type (either n-type or p-type) compared to that of the underlying first semiconductor material 10. Thus, the semiconductor material stack of the present invention forms a semiconductor material junction that is intrinsic/intrinsic, intrinsic/non-intrinsic, non-intrinsic/intrinsic or non-intrinsic/non-intrinsic. In embodiments in which a non-intrinsic/non-intrinsic semiconductor material junction is provided, the semiconductor material junction may be one of n-type/n-type, p-type/n-type, n-type/p-type or p-type/p-type.

The second semiconductor material 12 is formed on the first semiconductor material 10 utilizing an epitaxial growth (i.e., epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. Thus, and in the present application, the second semiconductor material 12 has an epitaxial relationship, i.e., same crystal orientation, as that of the surface of the first semiconductor material 10.

Examples of various epitaxial growth process that are suitable for use in forming the second semiconductor material 12 of the present application include, e.g., metalorgano chemical vapor deposition (MOCVD), rapid thermal chemical vapor deposition (RTCVD), low-energy plasma deposition (LEPD), ultra-high vacuum chemical vapor deposition (UH-VCVD), atmospheric pressure chemical vapor deposition (APCVD) or molecular beam epitaxy (MBE). The temperature for epitaxial deposition process for forming the second semiconductor material 12 typically ranges from 550° C. to 900° C. Although higher temperature typically results in faster deposition, the faster deposition may result in crystal defects and film cracking.

A number of different source gases which are well known to those skilled in the art may be used for the deposition of the second semiconductor material 12. Carrier gases like hydrogen, nitrogen, helium and argon can be used during the epitaxial growth process. In embodiments in which the second semiconductor material 12 is hydrogenated, hydrogen can be introduced during the epitaxial growth process. In some embodiments, no dopant is present during the epitaxial deposition of the second semiconductor material 12. In other embodiments, dopants can be present during the epitaxial growth of the second semiconductor material 12. In some embodiments, no dopant is present during the epitaxial growth of the second semiconductor material 12, but dopants can be introduced into the epitaxially grown second semiconductor material 12 by utilizing one of ion implantation, gas phase doping or out-diffusion of dopants from a dopant source material.

The second semiconductor material 12 that is formed on the first semiconductor material 10 may have a thickness that is from 5 nm to 5000 nm. Other thicknesses that are lesser than or greater than the aforementioned thickness range may also be employed as the thickness of the second semiconductor material 12.

Figure 2:
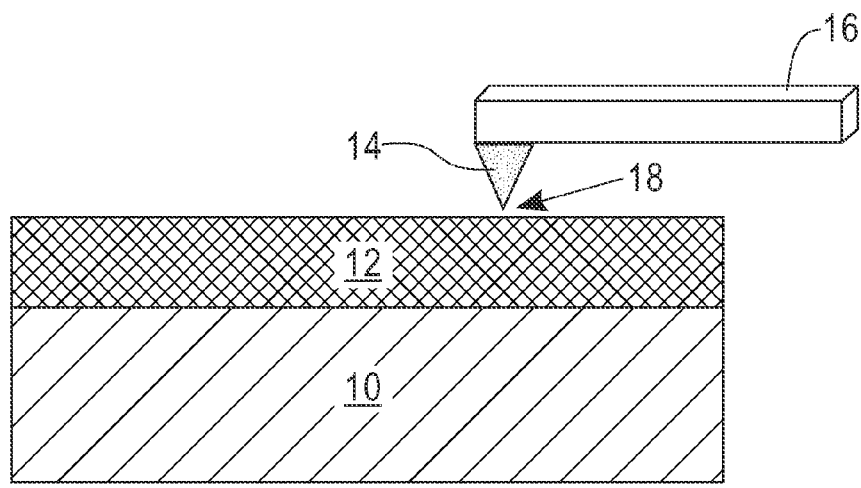
FIG. 2 is a cross sectional view of the exemplary semiconductor structure of FIG. 1 during scanning of the second semiconductor material of the semiconductor material stack using an atomic force microscope (AFM) operating in a tapping mode.

Referring now to FIG. 2, there is illustrated the exemplary semiconductor structure of FIG. 1 during scanning of the second semiconductor material 12 of the semiconductor material stack using an atomic force microscope (AFM) operating in a tapping mode. The scanning process of the present application can be used to determine/measure crystal defects that intersect with a topmost surface of the second semiconductor material 12 of the semiconductor material stack. By "intersect with a topmost surface of the second semiconductor material 12" it is meant crystal defects such as threading defects and/or stacking faults that have at least one surface that is present at a surface of the second semiconductor material 12 that is opposite the surface of the second semiconductor material 12 that forms an interface with the underlying first semiconductor material 10.

The atomic force microscope (AFM) that can be used in the present application includes any conventional AFM that can be used to measure the topography and surface roughness of a material layer. The atomic force microscope (AFM) that can be used in the present application includes a plurality of scanning probes. In FIG. 2, a single scanning probe 14 is shown for illustrative purposes. Each scanning probe 14 is attached to one end of a cantilever 16 (or body) as known in the art. Each scanning probe 14 has a tip 18 having a radius of curvature. In one embodiment of the present application, the radius of curvature of tip 18 is from 1 nm to 10 nm. In another embodiment of the present application, the radius of curvature of the tip 18 is from 1 nm to 3 nm. In yet another embodiment of the present application, the radius of curvature of the tip 18 is from 3 nm to 9 nm.

In one embodiment of the present application, the scanning probe 14 and tip 18 can be made of silicon or any another type of semiconductor material. In some embodiments, a Si probe and tip can be made by isotropically etching a silicon pillar structure until the required sharpness is reached. In some embodiments, the probe tip 18 may be a semiconductor nanowire that is formed on a semiconductor base that defines the body of the scanning probe 14.

The atomic force microscope (AFM) that is used in the present application is employed in a tapping mode (i.e., intermittent tip contact). In such a mode, the cantilever 16 is typically oscillated with a large amplitude from 100 nm to 200 nm. In such a mode, short range forces are detectable without sticking to the surface of the second semiconductor material 12. The short range forces that are detectable are translated to topography by a sensor (not shown). The sensor can be any conventional sensor used in atomic force microscopy including, for example, a bulk-component-based free-space laser beam deflection setup with a four quadrant photodiode acting as the deflection sensor. An example of another sensor that can be employed in the present application is a piezoresistive deflection sensor.

In accordance with an embodiment of the present application, the scanning of the topmost surface of the second semiconductor material 12 comprises a raster scan. By "raster scan" it is meant that the scanning probe 14 sweeps horizontally left-to-right (or right-to-left) at a steady rate, then blanks and rapidly moves back to the left (or right), where it turns back on and sweeps out the next line.

In accordance with an embodiment of the present application, scanning is performed at a frequency from 1 Hz to 1 khz. In another embodiment of the present application, scanning is performed at a frequency from 50 kHz to 500 kHz. In accordance with yet another embodiment of the present application, scanning is performed at a frequency from 5 Hz to 3 Hz. In accordance with an embodiment of the present application, scanning is performed at a step size from 1 nm to 10 nm. In another embodiment of the present application, scanning is performed at a step size from 1 nm to 5 nm. In yet another embodiment of the present application, scanning is performed at a step size from 2 nm to 50 nm.

The atomic force microscope (AFM) that is employed in the present application provides an image (i.e., topography image) of the topmost surface of the second semiconductor material 12. Defects appear as point depressions on the AFM image for the TD defect. For the SF defect they appear as lines or boxes of low height material on the image. From the image that is provided, the density of crystal defects that intersect with the topmost surface of the second semiconductor material 12 can be calculated. The calculating of the density of crystal defects that intersect with the topmost surface of the second semiconductor material 12 can be performed by identifying discrete small spatial resolution regions (or features) which have signature regions of less height than the surrounding material. Next, the discrete identified regions (or features) are totaled and thereafter the areal density of the discrete identified regions (features) is calculated. The density can be reported as the number of crystal defects divided by area, in $cm^2$, of the analyzed region.

The atomic force microscope (AFM) that can be used in the present application can measure crystal defects that intersect with the topmost surface of the second semiconductor material 12 that have a defect density that is less (i.e., less than $10^6$ defects per square centimeter) than a conventional Plan-view transmission electron microscopy (PV-TEM). Typically, the atomic force microscope (AFM) that can be used in the present application can measure crystal defects that have a defect density of from $10^4$ defects per square centimeter to $10^{10}$ defects per square centimeter.

Figure 3:
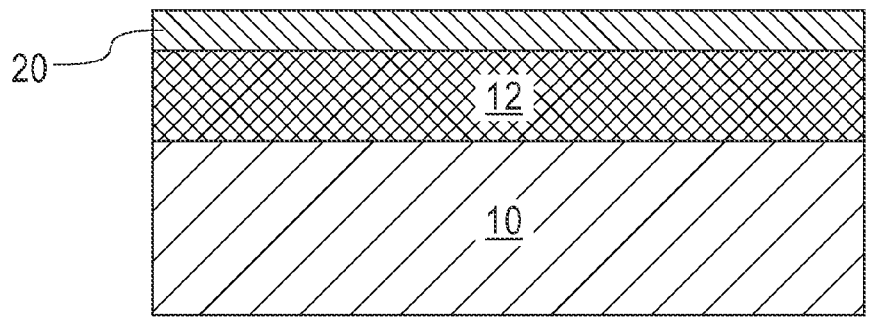
FIG. 3 is a cross sectional view of the exemplary semiconductor structure of FIG. 2 after epitaxially depositing another semiconductor material having a third lattice constant that may or may not differ from the second lattice constant and is selected from an III-V compound semiconductor and germanium on the second semiconductor material.

Referring now to FIG. 3, there is illustrated the exemplary semiconductor structure of FIG. 2 after epitaxially depositing another semiconductor material 20 on the second semiconductor material 12. The another semiconductor material 20 has a third lattice constant that may or may not differ from the second lattice constant and is selected from an III-V compound semiconductor and germanium. The another semiconductor material 20 may be single crystalline or multicrystalline. The another semiconductor material 20 may be hydrogenated or non-hydrogenated. The another semiconductor material 20 can be intrinsic or doped. In one embodiment and when doped, the another semiconductor material 20 can have a same conductivity type dopant as the second semiconductor material 12. In another embodiment and when doped, the another semiconductor material 20 can have an opposite conductivity than the second semiconductor material 12. The another semiconductor material 20 can be epitaxially deposited as described above in providing the second semiconductor material 12. The another semiconductor material 20 can have a thickness within the range provided above for the second semiconductor material.

The another semiconductor material 20 may then be scanned using an atomic force microscope (AFM) as described above to determine the density of crystal defects that intersect with the topmost surface of the another semiconductor material 20.

Additional semiconductor materials (not shown) can be formed by epitaxial deposition one atop the other. Each additional semiconductor material has a lattice constant that may or may not differ from the previous lattice constant and is selected from an III-V compound semiconductor and germanium. The density of crystal defects that intersect with the topmost surface of a particular semiconductor material can be determined as described above.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A non-destructive method of measuring crystal defects in a semiconductor structure, said method comprising:
   providing a semiconductor material stack of, from bottom to top, a first semiconductor material having a first lattice constant and a second semiconductor material having a second lattice constant that may or may not differ from said first lattice constant and is selected from an III-V compound semiconductor and germanium, wherein the second semiconductor material have a thickness that is from 5 nm to 5000 nm;
   scanning a topmost surface of said second semiconductor material using atomic force microscope (AFM) operating in a tapping mode to measure crystal defects that intersect said topmost surface of said second semiconductor material and to provide an image of said topmost surface of said second semiconductor material; and
   calculating a density of said crystal defects that intersect said topmost surface of said second semiconductor material.

2. The method of claim 1, wherein said providing said semiconductor material stack comprises:
   epitaxially depositing said second semiconductor material on said first semiconductor material.

3. The method of claim 1, wherein said first semiconductor material is silicon and said second semiconductor material is an III-V compound semiconductor.

4. The method of claim 3, wherein said III-V compound semiconductor contains an n-type dopant.

5. The method of claim 3, wherein said III-V compound semiconductor contains a p-type dopant.

6. The method of claim 1, wherein said first semiconductor material is silicon and said second semiconductor material is germanium.

7. The method of claim 6, wherein said germanium contains an n-type dopant.

8. The method of claim 6, wherein said germanium contains a p-type dopant.

9. The method of claim 1, wherein said crystal defects are selected from stacking faults, threading defects and combinations thereof.

10. The method of claim 1, wherein said atomic force microscope (AFM) comprises a plurality of scanning probes, each scanning probe is attached to one end of a cantilever.

11. The method of claim 10, wherein each scanning probe has a tip having a radius of curvature.

12. The method of claim 11, wherein said radius of curvature is from 1 nm to 10 nm.

13. The method of claim 1, wherein said scanning comprises a raster scan.

14. The method of claim 1, wherein said scanning is performed at a frequency from 1 Hz to 1 kHz.

15. The method of claim 1, wherein said scanning is performed at a step size from 1 nm to 10 nm.

16. The method of claim 1, wherein said tapping mode comprises intermittent contact of a probe tip on said topmost surface of said second semiconductor material.

17. The method of claim 1, wherein said calculating said density of said crystal defects comprises totaling of discrete identified features in an image and calculating an areal density of said features.

18. The method of claim 1, wherein said topmost surface of said second semiconductor material is not subjected to etching prior to said scanning.

19. The method of claim 1, further comprising epitaxially depositing another semiconductor material having a third lattice constant that may or may not differs from said second lattice constant and is selected from an III-V compound semiconductor and germanium on said second semiconductor material and after said scanning and said calculating.

20. The method of claim 19, further comprising measuring crystal defects in said another semiconductor material, wherein said measuring said crystal defects comprises:
  scanning a topmost surface of said another semiconductor material using atomic force microscope (AFM) operating in a tapping mode to provide an image of said topmost surface of said another semiconductor material; and
  calculating a density of crystal defects that intersect said topmost surface of said another semiconductor material.

* * * * *